SEMICONDUCTOR DEVICE

Filed Sept. 20, 1963

INVENTOR
ROBERT L. KOCH

BY

Curtis, Morris and Safford
ATTORNEYS

United States Patent Office 3,231,797

Patented Jan. 25, 1966

3,231,797

SEMICONDUCTOR DEVICE

Robert L. Koch, Easton, Conn., assignor to National Semiconductor Corporation, Danbury, Conn.

Filed Sept. 20, 1963, Ser. No. 310,375
13 Claims. (Cl. 317—235)

Figure 1:
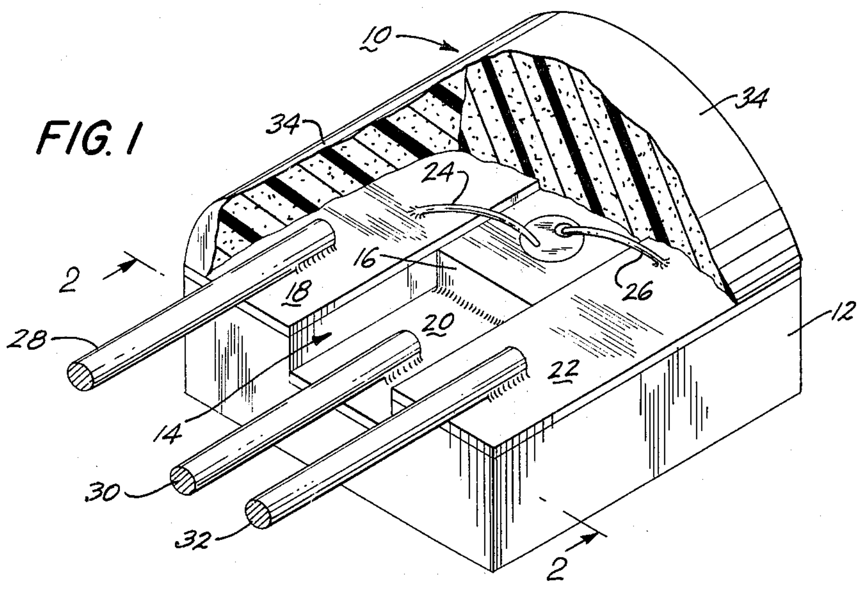

This invention relates to electrical semiconductor devices and to means for mounting and protecting them. More particularly, this invention relates to micro-miniature transistors and to means for mounting and protecting such transistors.

Recent improvements in techniques for producing semiconductor devices have made it possible to make the devices extremely small. For example, transistors have been formed using thin semiconductor wafers only two hundreds of an inch square, or even smaller. Such tiny transistors are termed "micro-miniature" transistors. They find particularly advantageous use in hearing aids and similar applications where their small size is a substantial advantage.

A major problem encountered in using such tiny transistors is that their lead wires are extremely fine; e.g. of the order of one mil (one thousandth of an inch) in diameter. Use of such small diameter lead wires is necessary because of the extremely small size of the areas on the transistors to which the wires must be attached. These fine lead wires are extremely difficult to use in making external connections to the transistor since they are so thin that they are very difficult to solder and handle. This disadvantage makes the tiny transistor difficult and expensive to install in electrical equipment.

Another problem with semiconductor devices of all sizes is that when the semiconductor wafer is exposed to the atmosphere it often becomes contaminated and its electrical characteristics change over a period of time. This problem is especially difficult to solve if the device is of a micro-miniature size.

Accordingly, an object of this invention is to provide micro-miniature semiconductor devices whose lead wires are large enough to be easily soldered and handled in assembling electronic equipment using the devices.

Another object of this invention is to provide such micro-miniature semiconductor devices which are protected from contamination by exposure to the atmosphere.

Another object of this invention is to provide such devices which are simple and relatively inexpensive to produce.

The drawings and descriptions that follow describe the invention and indicate some of the ways in which it can be used so as to meet the above-stated objects. In addition, some of the advantages provided by the invention will be pointed out.

Figure 2:
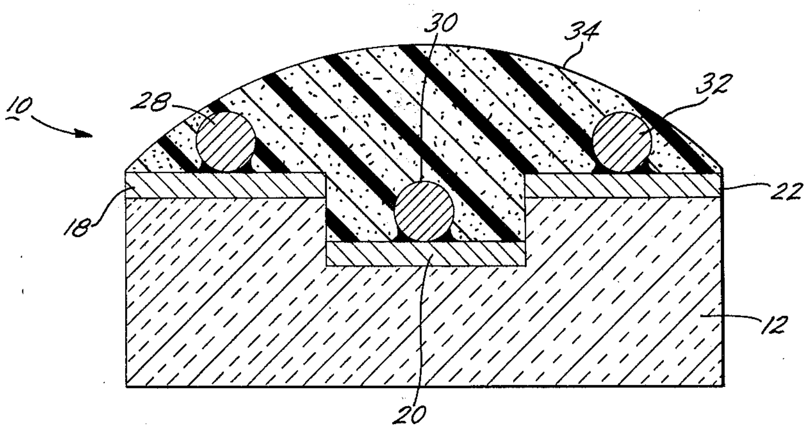

In the drawings:

FIGURE 1 is a perspective view, partially cut-away, of a semiconductor device constructed in accordance with the present invention; and FIGURE 2 is a cross-sectional view taken along lines 2—2 of FIGURE 1.

The semiconductor device generally indicated at 10 in FIGURES 1 and 2 comprises a mounting block 12 made of ceramic material and having a central, rectangularly-shaped groove 14 into which a transistor 16 is secured. This groove 14 gives the block 12 three flat, separated upper surfaces. Three thin metallic strips 18, 20 and 22 cover the surfaces. Strips 18 and 22 appear on the upper surfaces of block 12 and strip 20 appears on the bottom surface of groove 14. These strips are shown disproportionately thick in the drawings in order to show them clearly.

Each of metallic strips 18, 20 and 22 consists of a substrate of nickel and molybdenum or similar metals sintered to the ceramic material with a thin layer of gold electroplated on the substrate.

The transistor is mounted in the ceramic base 12 by bonding the lower surface of transistor 16 to the gold-coated strip 20 located in the bottom of channel 14. The length of the channel 14 is made greater than that of the transistor 16 so that there is a portion of the channel which is not occupied by the transistor. The depth of channel 14 is made equal to or greater than the thickness of the transistor wafer so that the upper surface of the wafer is flush with or below the upper surfaces of block 12 and the leads connected to the top of the transistor are not likely to make contact with the wafer and become short-circuited.

Two thin wires 24 and 26 are secured, respectively, to the base and emitter regions of transistor 16 which are located on the upper surface of the transistor wafer. The free ends of these wires are thermal-compression bonded to strips 18 and 22, respectively. Wires 24 and 26 are extremely fine, having a diameter of the order of one mil (one thousandth of an inch) and are difficult for assembly personnel using ordinary equipment to handle. However, bonding of these thin wires to strips 18 and 22 is performed without special difficulty by use of techniques and personnel ordinarily used in the manufacture of transistors.

One end of each of three large lead wires 28, 30 and 32 is welded to gold-coated strips 18, 20 and 22, respectively. These lead wires have a diameter substantially larger than that of wires 24 and 26, e.g., of the order of five mils in diameter. They are relatively easy to solder and handle and, therefore, easily can be connected by hand into electrical assemblies. Large wire 28 is connected through strip 18 to fine wire 24 and thus serves as the base lead for the device 10. Large wire 32 similarly serves as the emitter lead for the device. The bottom surface of transistor 16 is its collector electrode, and large wire 30 serves as the collector lead for device 10 because of its connection to the bottom of transistor 16 through strip 20.

A relatively thick coating 34 of epoxy resin covers the entire upper surface of the assembly so as to protect the transistor 16 and the various connections made in the assembly from deterioration due to exposure to the atmosphere. As is clearly shown in FIGURE 2, the epoxy resin fills channel 14. The epoxy resin may be selected from any of a number of commercially available substances. It is preferably black and opaque so as to prevent light from striking the transistor 16 and possibly affecting its operation. Also, the epoxy material should have good moisture-resisting and reasonably good thermal conductivity characteristics.

The preferred material for mounting block 12 is aluminum oxide ($Al_2O_3$), but any material having good insulating properties and to which metal strips can be secured may be used instead.

The resulting semiconductor device 10 is very small in size, e.g., 60 mils square by 30 mils thick, and yet is easily soldered or otherwise assembled in electrical equipment. It is practically impervious to atmospheric contamination, yet it is inexpensive to produce.

The above description of the invention is intended to be illustrative and not limiting. Various changes or modifications in the embodiments described may occur to those skilled in the art and these can be made without departing from the spirit or scope of the invention as set forth in the claims.

I claim:

1. A semiconductor device comprising, in combination, a support-block of electrically insulating material, a recess in a first surface of said support-block, said recess forming a second surface recessed from said first surface, at least two conductive members, each of said members being secured to a different one of said surfaces, a semiconductor body mounted on said support-block, said semiconductor body having at least two electrodes, each of said electrodes being conductively connected to a different one of said conductive members, and means for making external electrical connections to said conductive members and thus making external electrical connections to said semiconductor body.

2. A device as in claim 1 including a plastic encapsulating material covering said semiconductor body.

3. A device as in claim 1 including at least one electrode wire forming a conductive connection between one of said electrodes and one of said conductive members and in which said external connection means includes at least one lead wire connected to said one conductive member, said lead wire having a thickness substantially greater than the thickness of said electrode wire.

4. A device as in claim 1 in which said semiconductor body is secured to said support-block by being secured to one of said conductive members with one of said electrodes in ohmic contact with said one conductive member.

5. A transistor device comprising a flat support-block made of ceramic insulating material, a rectangular channel in one surface of said block, said channel forming raised lands at the sides of said channel and benig open at both of its ends, a separate metal coating on each of said lands and on the bottom surface of said channel, a semiconductor body comprising a transistor in the form of a wafer whose bottom surface is its collector electrode and which has base and emitter electrodes on its upper surface, said bottom surface of said wafer being bonded to the metal coating on the bottom of said channel, a pair of electrode wires, one of said wires being connected between one of said land coatings and said base electrode, and the other of said wires being connected between the other of said land coatings and said emitter electrode, three external lead wires, each having one end bonded to a separate one of said coatings and its other end extending beyond said support block, each of said lead wires having a thickness substantially greater than the thickness of said electrode wires.

6. A semiconductor device capable of being made in very small sizes and yet being easily assembled in electrical equipment, said device comprising, in combination, an electrically non-conductive base-block, said base-block having a first surface with a recess, said recess having at least one side-wall and a bottom surface electrically isolated from said first surface, a strip of conductive material secured to each of said surfaces, a semiconductor body secured to said block, said body having at least two electrodes and at least one electrode lead wire connected to one of said electrodes, each of said electrode lead wires being secured to a separate one of said strips, and a plurality of conductors each of which s secured to one of said conductive strips, said conductors being greater in thickness than said electrode lead wires of said semiconductor body.

7. A device as in claim 6 including an epoxy resin coating covering said semiconductor body and the connections between said conductive strips, said electrode lead wires and said conductors.

8. A semiconductor device capable of being made in very small sizes and yet being easily assembled in electrical equipment, said device comprising, in combination, an electrically non-conductive base-block, said base-block having a recess in one of its surfaces, said recess having at least one side wall and a bottom wall, a semiconductor body mounted on said bottom wall of said recess, said recess having a depth such that the surface of said body located farthest away from the bottom of said recess is substantially flush with said one surface of said block, said body having at least one electrode lead wire, and a conductor having a thickness greater than that of said electrode lead wire, said electrode lead wire being connected to said conductor and said conductor being secured to said one surface of said block.

9. A device as in claim 8 including an epoxy resin coating covering said semicondutor body and the connections between it and said electrode lead wire and between said lead wire and said conductor.

10. A semiconductor device comprising, in combination, a block of electrically insulating material, a recess in one surface of said block, said reces having side walls and a bottom surface, a conductive coating on said one surface and another conductive coating on said bottom surface of said recess, a junction semiconductor body mounted on and having one electrode in ohmic contact with said conductive coating on said bottom surface of said recess, with the outermost surface of said semiconductor body being substantially flush with said one surface of said block, at least one electrode lead wire connected to an electrode fronting on said outermost surface of said element, said lead wire being connected to said conductive coating on said one surface of said block, and at least two relatively thick conductors, each of which is bonded to one of said conductive coatings.

11. A device as in claim 10 including an epoxy resin layer covering said body and the connections between said element, said lead wire, said coatings and said conductors.

12. A device as in claim 10 in which said recess has the shape of a channel and extends completely across said one surface of said block so as to divide said one surface into separated regions having conductive coatings electrically isolated from one another, which includes at least two electrode lead wires each of which is connected to one of said coatings on said separated regions and to an electrode fronting on said outermost surface of said element, and at least three conductors each of whose thickness is greater than that of said lead wires, each of said conductors respectively being electrically connected and secured to one of said conductive coatings.

13. A device as in claim 12 including an opaque epoxy resin layer covering said body and all of the connections between said body, said lead wires, said conductive coatings and said conductors.

References Cited by the Examiner

UNITED STATES PATENTS

| | | | |
|---|---|---|---|
| 2,629,802 | 2/1953 | Pantchechnikoff | 317—235 X |
| 2,985,806 | 5/1961 | McMahon et al. | 317—235 |
| 3,021,461 | 2/1962 | Oakes et al. | 317—235 |
| 3,072,832 | 1/1963 | Kilby | 317—235 |
| 3,176,191 | 3/1965 | Rowe | 317—101 |

FOREIGN PATENTS

| | | |
|---|---|---|
| 1,099,888 | 9/1955 | France. |

JOHN W. HUCKERT, *Primary Examiner.*

A. M. LESNIAK, *Assistant Examiner.*